United States Patent [19]

Schwarz et al.

[11] Patent Number: 4,525,734
[45] Date of Patent: Jun. 25, 1985

[54] HYDROGEN CHARGED THIN FILM CONDUCTOR

[75] Inventors: James A. Schwarz, Fayetteville; Robert W. Pasco, Syracuse, both of N.Y.

[73] Assignee: Syracuse University, Syracuse, N.Y.

[21] Appl. No.: 477,503

[22] Filed: Mar. 21, 1983

[51] Int. Cl.³ .................... H01L 23/36; H01L 23/48
[52] U.S. Cl. ........................ 357/67; 357/65; 357/68; 357/78
[58] Field of Search ................ 357/78, 67, 68, 65

[56] References Cited

U.S. PATENT DOCUMENTS 3,725,309  4/1973  Ames et al. ................ 357/65
4,017,890  4/1977  Howard et al. ............. 357/65
4,166,279  8/1979  Gangulee et al. .......... 357/65

OTHER PUBLICATIONS

IBM Technical Disclosure Bulletin vol. 13 #6, "Aluminum Land Metallurgy With Copper on the Surface" by Daley et al., Nov. 1970.
Journal of Vacuum Science and Technology, vol. 17, 1980 "Effects of Hydrogen Incorporation in Some Deposited Metallic Thin Films" by Donald Meyer (pp. 322-326).
IBM TDB vol. 13, #5, p. 1124 Oct. 1970, "Titanium Overlay on Metallurgy" by Gnieweh.
IBM TDB vol. 21, #12 pp. 4837-4838, May 1979, "Electromigration Improvement . . . Conductors" by Howard.
IBM TDB vol. 20 #9 pp. 3477-3479, Feb. 78, "Fabrication of Intermettalic Diffusion Barriers for Electromigration . . . " by Howard.

Primary Examiner—Andrew J. James
Assistant Examiner—M. Prenty
Attorney, Agent, or Firm—Bruns and Wall

[57] ABSTRACT

A thin film conductive stripe having increased resistance to electromigration wherein a conductive element is alloyed with at least one other hydrogen storage element capable of accepting and holding hydrogen internally within the thin film stripe and the stripe is annealed in a hydrogen atmosphere to react hydrogen with the storage material to charge the stripe with hydrogen.

3 Claims, 2 Drawing Figures

HYDROGEN CHARGED THIN FILM CONDUCTOR

BACKGROUND OF THE INVENTION

This invention relates to thin film conductors and, in particular, to improved thin film stripes having high resistance to electromigration.

Thin, narrow stripes formed of a conductive material such as aluminum have been used for some time in solid state devices to interconnect various types of system related components. Similar conductive stripes are also now being used in magnetic bubble memories. As the state of the art in these integrated circuit applications approaches Very Large Scale Integration (VLSI), the physical size of the interconnects become correspondingly small and the ability of the interconnect to resist electromigration damage (EMD) becomes increasingly important. As the size of the interconnect approaches micron and submicron dimensions, the current density carried by the stripe increases to a point where a mass transport of atoms takes place resulting in the creation of voids in one area of the stripe and a thickening of the conductor in a second area downstream from the first in the direction of current flow. Generally at current densities below $10^4$ amp/cm$^2$ electromigration has little effect on the life of a thin film conductor. However, at current densities of about $10^5$ amp/cm$^2$ and above, EMD takes place and reduces the life expectancy of the circuit. Failure can be produced by an open circuit being created in the void region or a short circuit being generated in the thickened area as the expanded material comes in contact with another conductor. It should be further noted that many thin film conductors of this type are provided with a passivation layer such as glass which becomes fractured by the material build-up. The fracture can expose the electronic component to a hostile atmosphere thus further inducing early failure of the current carrying device.

It has been noted by many investigators that a hydrogen containing ambient considerably improves the electromigration behavior of a thin film conductor. Evidence has been developed that a substantial reduction in solid state transport can be achieved through interaction of active gases such as hydrogen with thin film conductors or bimetallic diffusion couples. The rate of intermetallic compound formation is reduced dramatically in diffusion couple devices when the device is placed in a hydrogen environment rather than air. See D. Y. Shih and P. J. Ficalora, Proc. IEEE International Reliability Phys. Sympos. pgs. 87-90 (1979). It has also been noted that the mean time to failure (MTF) of a thin film conductor is increased considerably when an aluminum stripe is vacuum deposited in an atmosphere containing hydrogen. See for example, D. E. Meyer, Journal of Vacuum Science Technol., Vol. 17 pgs. 322-326 (1980).

The technological importance of a hydrogen ambient is now apparent. It can also be shown that a substantial improvement in electromigration behavior is realized by use of this technique when compared to results obtained by changing the composition of the conductor. U.S. Pat. Nos. 4,352,239; 4,017,890; 4,166,279; 4,268,584 and 3,725,309 all represent various compositional arrangements that are utilized for the purpose of suppressing electromigration in conductive stripes. However, to date little is known about the mechanism by which either compositional or ambient changes actually affect electromigration in a micron or submicron conductor.

SUMMARY OF THE INVENTION

It is therefore an object of the present invention to improve thin film interconnectors.

It is a further object of the present invention to extend the usable life of a thin film conductor that is used in a high current density application.

A still further object of the present invention is to suppress electromigration in micron and submicron conductors.

Another object of the present invention is to provide more reliable microelectronic circuits.

These and other objects of the present invention are attained by means of a thin film conductor having high resistance to electromigration that is formed of an alloy containing a conductive metallic element and at least one other element that is capable of storing hydrogen. The alloy is annealed in a hydrogen atmosphere before or during initial current stressing to combine hydrogen with the storage element and thus precharge the conductor with hydrogen.

BRIEF DESCRIPTION OF THE DRAWINGS

For a better understanding of these and other objects of the present invention reference is had to the following detailed description of the invention which is to be read in conjunction with the accompanying drawings, wherein.

DESCRIPTION OF THE INVENTION

Figure 2:
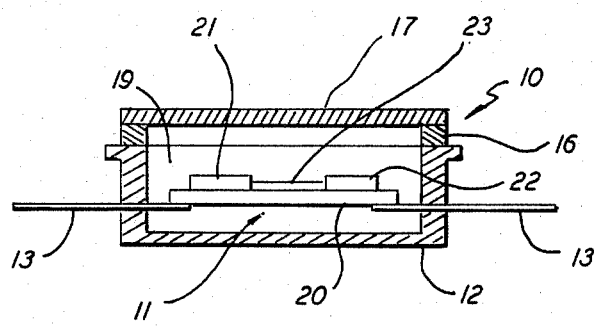
FIG. 2 is an enlarged view in section of a microelectronic package embodying the teachings of the present invention.

Referring initially to FIG. 2, there is illustrated a hermetic package 10 containing an integrated circuit 11 for use in a microelectronic system. The package is in a flat pack configuration and is shown in exaggerated size for the purpose of explanation. The package includes a housing 12 that has horizontally disposed leads 13—13 passing through opposed side walls to which an internally stored integrated circuit 11 is electrically connected. The upper edge of the housing is provided with a gold-tin solder preform or seal 16 to which a Kovar lid 17 is secured. When the lid is in place, the assembly is heated to a temperature sufficiently high enough to allow the solder to flow onto the lid and the housing thus creating a hermetic seal. A hydrogen containing atmosphere 19 is placed within the housing which completely envelopes the microelectronic circuitry.

As is typical in the art, the integrated circuit includes a substrate 20 upon which is placed one or more electrical components such as components 21 and 22. A thin film interconnect or stripe 23 electrically joins the components in assembly. The stripe can be placed of the substrate by anyone of many known techniques that include vacuum deposition or sputtering. In this particular embodiment, the thin film conductor is arranged to pass current densities in excess of $10^5$ amp/cm$^2$ and is thus subject to electromigration and electromigration damage, which, if not suppressed, will eventually produce electrical failure of the device.

The thin film stripe is formed of a current carrying element that has been alloyed with a second element which has the ability to accept and store hydrogen internally. Preferably, the current carrying or conductive element is aluminum and the hydrogen storage element is titanium that has been alloyed with the aluminum in an amount by weight of between 0.01% and 0.25%. Alloying is accomplished by any suitable means known and used in the art. After it has been deposited on the substrate, the thin film is annealed at a temperature of between 400°–500 °C. while situated in a hydrogen atmosphere. The solubility of titanium in aluminum is about 0.07 to 0.08% by weight at these annealing temperatures. Any titanium that is not in solution will be in a $TiAl_3$ intermetallic form. See M. Hansen, Constitution of Binary Alloys, 2nd Ed., McGraw Hill (1958).

The solubility of hydrogen in titanium is substantial. The hydrogen forms both a solid solution with titanium which has a relatively strong chemical bond and a compound in the form of a hydride such as $TiH_2$.

At an annealing treatment temperature of 400°, approximately 30% of the titanium is in solid solution in the aluminum and about 70% is in the form of $TiAl_3$. The interaction of titanium with the hydrogen will differ depending upon whether the titanium is in solid solution or in the form of a second phase $TiAl_3$ precipitate. Because hydrogen is in solid solution in the alloy interstitially, its kinetics for association with titanium by means of a solid state transport mechanism is relatively rapid. On the other hand, titanium is also in solution in the thin film substitutionally and the formation of intermetallics proceeds at a slower rate.

Enhancement in the reliability of a thin film conductor can be effected by various combinations of aluminum alloy stripes and the processing of these compounds in hydrogen ambients before the stripe is current stressed. Aluminum alloys that have minor metallic components that form stable stoichiometric or stable nonstoichiometric compounds with hydrogen or which exhibit high heat of solution for hydrogen are listed below:

|  |  | Hydride* | Solubility in AL** |  |
|---|---|---|---|---|
| Group III-B | Scandium (Sc) | X |  | IMC |
|  | Yttrium (Y) | X | SSS | IMC |
|  | Rare Earths |  |  |  |
|  | Lanthanum (La) | X | SSS | IMC |
|  | Cerium (Ce) | X | SSS | IMC |
|  | Praseodymium (Pr) | X |  | IMC |
|  | Neodymium (Nd) | X |  | IMC |
|  | Promethium (Pm) | — | — | — |
|  | Samarium (Sm) | X |  | IMC |
|  | Europium (Eu) | X |  | IMC |
|  | Gadolinium (Gd) | X |  | IMC |
|  | Terbium (Tb) | X |  | IMC |
|  | Dysprosium (Dy) | X | SSS | IMC |
|  | Holmium (Ho) | X |  | IMC |
|  | Erbium (Er) | X | SSS | IMC |
|  | Thulium (Tm) | X |  | IMC |
|  | Ytterbium (Yb) | X |  | IMC |
|  | Lutetium (Lu) | X |  | IMC |
|  | Actinides |  |  |  |
|  | Thorium (Th) | X | SSS | IMC |
|  | Proactinium (Pa) | X | — | — |
|  | Neptunium (Np) | X |  | IMC |
|  | Plutonium (Pu) | X | SSS | IMC |
| Group IV-B | Titanium (Ti) | X |  | IMC |
|  | Zirconium (Zr) | X | SSS | IMC |
|  | Hafnium (Hf) | X | SSS | IMC |
| Group V-B | Vanadium (V) | X | SSS | IMC |
|  | Niobium (Nb) | X | SSS | IMC |
|  | Tantalum (Ta) | X | SSS | IMC |
| Group VI-B | Chromium (Cr) | X | SSS | IMC |
|  | Molybdenum (Mo) | X |  | IMC |
| Group VIII | Palladium (Pd) | X | SSS | IMC |

*X = Hydride forms or high H solubility
**SSS = Small Solid Solubility
IMC = Intermetallic Compound Thus, use of these elements alone or in different combinations could achieve hydrogen storage as noted above by annealing the conductor in hydrogen. Chemically hydrogen entrained in the alloy is stored in the form of a hydride or a solid solution (or any combination thereof) and thus will remain stored in the stripe over an extremely long period of time even when the stripe is exposed to relatively high temperatures and/or pressures at which conventional non-alloyed stripes rapidly fail.

Figure 1:
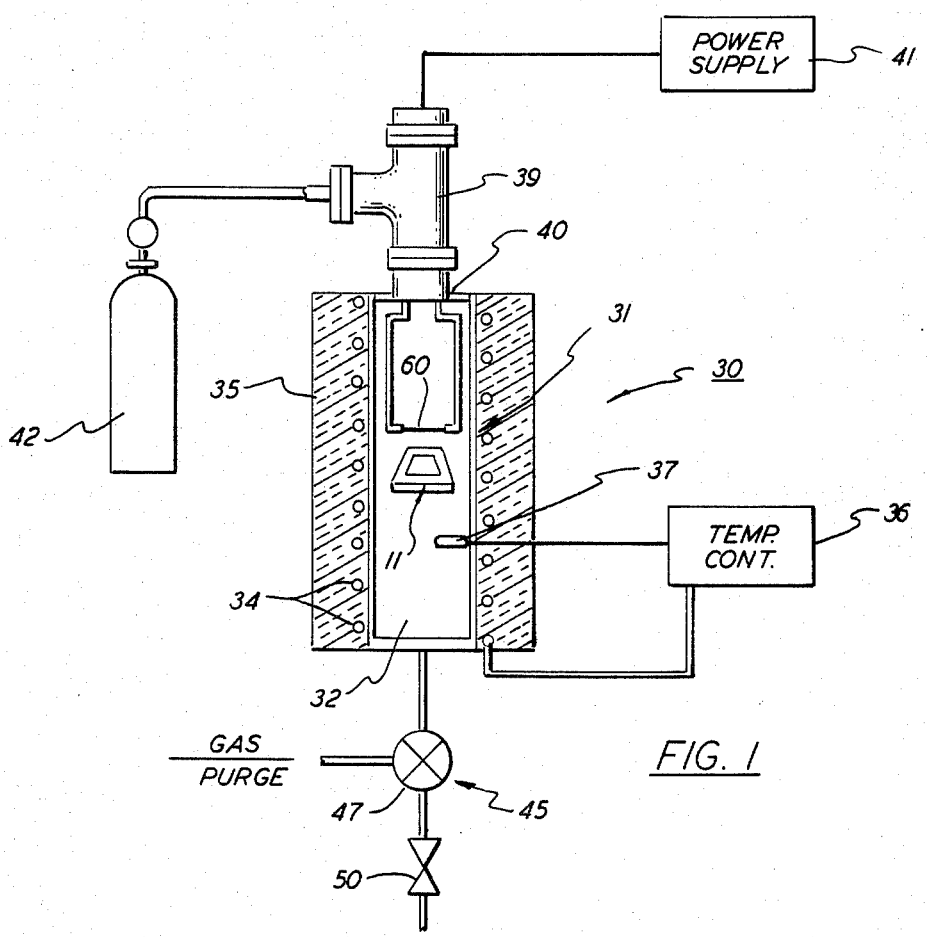
FIG. 1 is a schematic representation of an apparatus for use in carrying out the present invention.

Referring now to FIG. 1, there is shown apparatus for carrying out the present invention wherein a thin film conductor embodying the present invention is annealed in a hydrogen atmosphere. The apparatus includes an electrical furnace generally referenced 30, the temperature of which can be accurately controlled. The furnace includes an enclosed housing 31 having an interior chamber 32. The housing is wrapped by a heating blanket containing heating coils 34 and a thick layer of insulation 35 to prevent heat loss. The heating coils are operatively connected to a suitable temperature controller 36 and the chamber temperature is monitored by a thermocouple 37 which serves to hold the temperature at a desired level.

The integrated circuit 11 containing the aluminum alloy interconnect 23 is mounted inside the furnace housing chamber upon a suitable support which in practice can be the flat pack housing 12 shown in FIG. 2. A flanged connector 39 is secured in the top wall 40 of the furnace housing through which the chamber communicates with a gas supply 42 and an electrical power supply 41. A flow control system generally referenced 45 is connected into the chamber through the bottom wall of the furnace chamber. The system includes a control valve 47 and a relief valve 50.

Initially, the air atmosphere in the chamber is replaced by a hydrogen containing ambient provided by supply bottle 42. With the thin film bathed in a hydrogen ambient, the temperature of the furnace is brought up to a desired annealing temperature. The furnace is maintained at the annealing temperature for a sufficient period of time to allow the alloyed stripe to become fully charged with hydrogen. The annealing time and temperature will vary depending on the type of alloy used and the amount of hydrogen storing material added to the conductor material. After annealing, the stripe is cooled to room temperature thus providing a fully charged device. The stripe is allowed to cool in the hydrogen atmosphere. Upon cooling the device is removed from the furnace and the package is sealed using well known techniques with a hydrogen atmosphere contained therein. Accordingly, the thin film conductor or conductors contained in the package not only internally store hydrogen but also are adapted to operate in a hydrogen ambient thus extending the life of the device. An atmosphere containing a significant amount of hydrogen is preferred for the purpose of packaging.

As shown in FIG. 1, the storage of hydrogen within the stripe can be enhanced by dissociating hydrogen molecules to hydrogen atoms in the ambient during the annealing step. To this end a thin filament 60 is mounted in the furnace chamber directly above the integrated circuit being treated. The filament is electrically connected to an external power supply 41 through the flanged coupling. The temperature of the filament is raised during the annealing step to a level such that hydrogen molecules at or near the stripe are reduced to hydrogen atoms. By the same token, the metallic stripe element can be further alloyed with Group VIII metals such as platinum and nickel which have the ability of rendering the dissociation of hydrogen on the surface of the stripe and thus providing a very active form of hydrogen for chemical bonding to the film atoms and/or the storage element.

While this invention has been described with reference to the structure disclosed herein, it is not confined to the details set forth and this application is intended to cover any modifications or changes as may come within the scope of the following claims.

We claim:

1. A conductive thin film stripe that has high resistance to electromigration, at operating temperatures in excess of 100° C., said stripe comprising aluminum alloyed with at least one other element that forms a chemical bond with both aluminum and hydrogen, said at least one other element being selected from the group consisting of Group III-B, Group IV-B, Group VI-B, Group VIII and rare earth elements in the periodic table, and a compound containing hydrogen and said at least one other element that is stable at temperatures in excess of 100° C. whereby hydrogen is retained within the stripe at these elevated temperatures.

2. The thin film stripe of claim 1 wherein said at least one other element is a transition metal.

3. The thin film stripe of claim 1 that further includes a hermetically sealed housing for packaging said stripe.

* * * * *